United States Patent [19]

Nguyen

[11] Patent Number: 5,245,277
[45] Date of Patent: Sep. 14, 1993

[54] CLAMP FOR TESTING USED INTEGRATED CIRCUIT DEVICES

[75] Inventor: Justin A. Nguyen, San Jose, Calif.
[73] Assignee: Xilinx, Inc., San Jose, Calif.
[21] Appl. No.: 924,816
[22] Filed: Aug. 4, 1992
[51] Int. Cl.[5] .......................................... G01R 31/02
[52] U.S. Cl. ............................ 324/158 F; 324/158 P
[58] Field of Search ............... 324/72.5, 158 F, 158 P;
439/68, 69, 70, 73

[56] References Cited

U.S. PATENT DOCUMENTS

| | | | |
|---|---|---|---|
| 4,766,371 | 8/1988 | Moriya | 324/158 F |
| 4,940,935 | 7/1990 | Riley | 324/158 F |
| 4,962,356 | 10/1990 | Eberlein et al. | 324/158 F |
| 4,980,635 | 12/1990 | Walton et al. | 324/158 F |

Primary Examiner—Vinh Nguyen
Attorney, Agent, or Firm—Edel M. Young

[57] ABSTRACT

A clamp for a test socket for testing packaged integrated circuit devices, particularly used devices, includes grooves corresponding to original pin locations of the integrated circuit device. When an integrated circuit device having misaligned pins is placed in the test socket and the clamp is set upon the integrated circuit device and manually shifted against the integrated circuit device, grooves receive the pins, aligning any misaligned pins properly against contacts in the socket. Closing the socket causes the pins to be firmly aligned against the contacts for testing.

2 Claims, 4 Drawing Sheets

CLAMP FOR TESTING USED INTEGRATED CIRCUIT DEVICES

FIELD OF THE INVENTION

The following invention relates to testing of integrated circuit devices, particularly packaged integrated circuit devices which have been incorporated into a printed circuit board and then removed.

BACKGROUND OF THE INVENTION

Sockets for testing integrated circuit devices typically include a clamp for holding the integrated circuit device and a frame for pressing the device against contacts which match with pins of the integrated circuit device. FIG. 1 shows a prior art socket for holding an integrated circuit device to be tested. Such sockets are widely used in the integrated circuit manufacturing industry. Socket 100 comprises lid 101 and base 111 which are rotatably attached through hinge 105. An integrated circuit to be tested, 150 is inserted with the aid of alignment posts 107 onto contacts 109. Lid 101 is then lowered such that clamp 103 comes against the upper surface of integrated circuit device 150 so that clamp edges 103a come against pins 153 of integrated circuit device 150, pressing pins 153 firmly against contacts 109. This arrangement works successfully for newly manufactured integrated circuits in which all pins 153 are aligned with respect to each other and therefore seat correctly against contacts 109 when lid 101 is lowered.

A problem arises when using the structure of FIG. 1 for testing integrated circuit devices which have been attached to a printed circuit board and then removed because of an apparent defect. The attachment and removal process with consequent soldering and unsoldering of pins 153 typically results in pins 153 becoming misaligned with respect to each other and with respect to contacts 109. When a used device is reinserted into a socket such as socket 100, the pins may fail to contact their corresponding ones of contacts 109. A pin may contact more than a single contact 109 and thereby short adjacent contacts, or may even be lifted by solder remaining on some of pins 153 such that other of pins 153 may fail to contact their corresponding ones of contacts 109.

For PLCC packages, commercial pin-straiteners are available. Further, for PLCC packages, test sockets contact the sides of the pins close to where they leave the package, so the sockets are less sensitive to pin distortion. However, for PQFP and CQFP packages, which can have a finer pin pitch, no pin straighteners are available. These are very delicate packages. The chips must be inserted into the socket with a vacuum device for holding the chip in the proper orientation, and dropping it precisely into its position in the socket. When the pins are misaligned, it has usually not been possible to test these devices.

SUMMARY OF THE INVENTION

According to the present invention, a separate clamp section is provided for holding integrated circuit devices to be tested. This clamp section includes grooves corresponding to the proper position of pins in a new integrated circuit device. The grooves in this separate clamp cause pins which are somewhat misaligned to become properly aligned such that when a socket lid is closed against the novel clamp, all pins will properly align with their respective contacts, and the device can be properly tested.

DETAILED DESCRIPTION OF THE INVENTION

Figure 1:
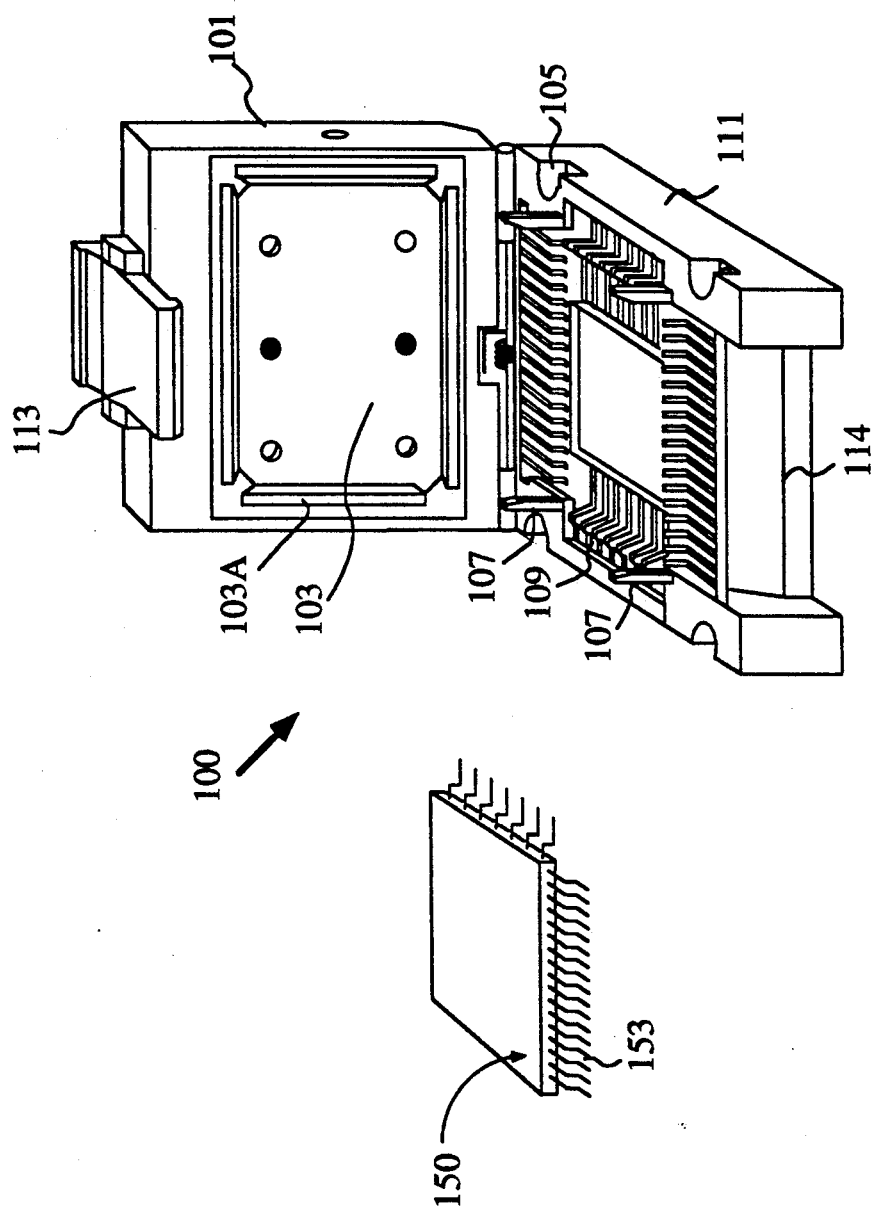
FIG. 1 shows a prior art socket for clamping an integrated circuit device into position for testing, and an integrated circuit device which can be clamped into the socket.
Figure 2:
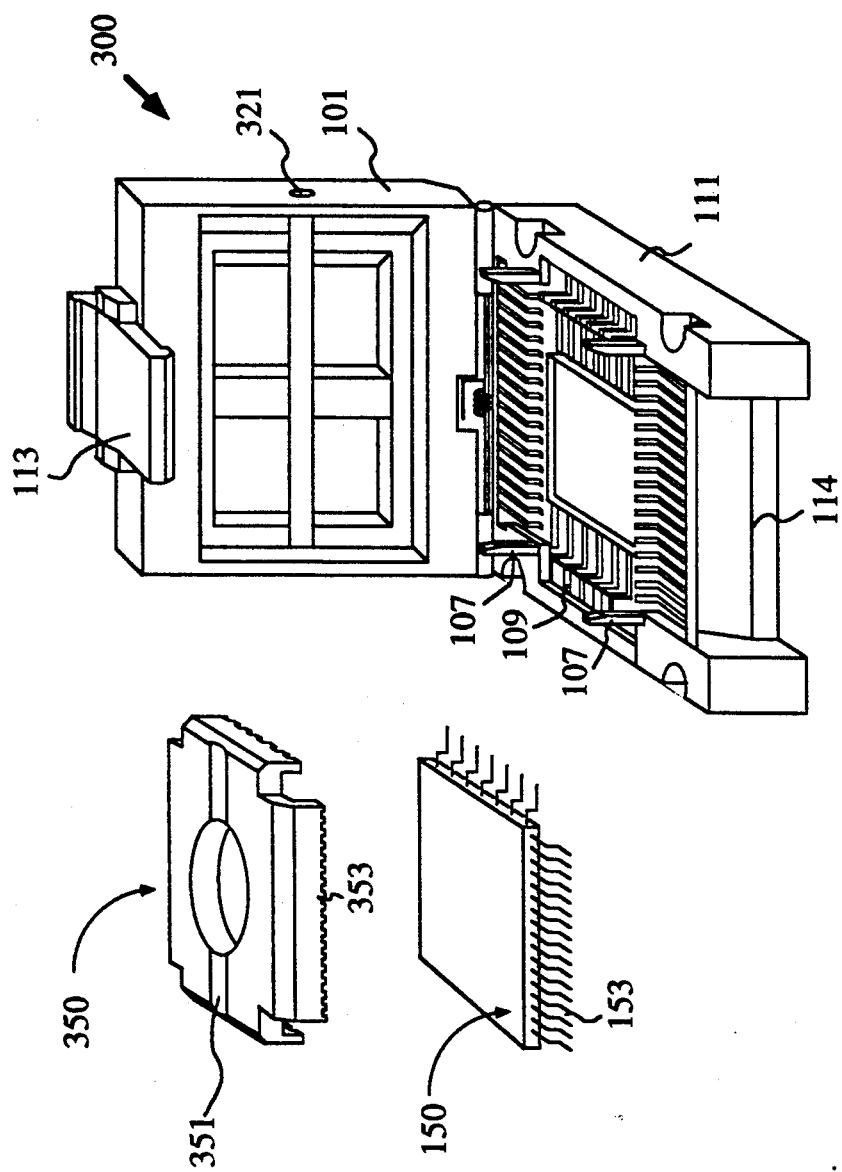
FIG. 2 shows a socket and a clamp of the present invention.
Figure 3A:
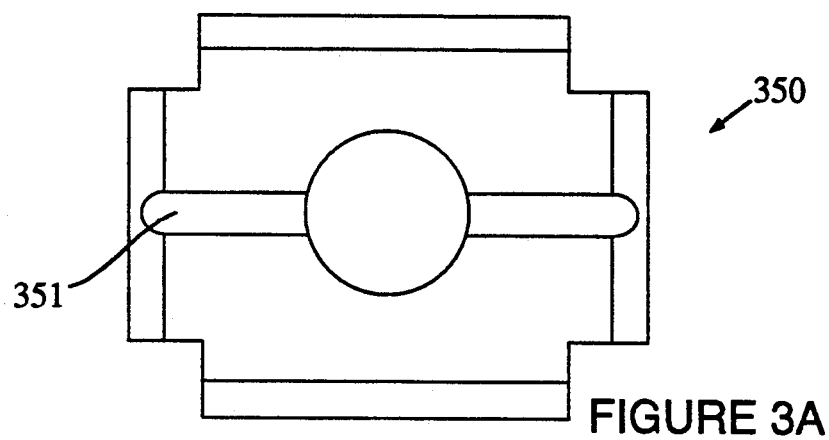
FIGS. 3a-3e show enlarged views of the clamp of the present invention.
Figure 3B:
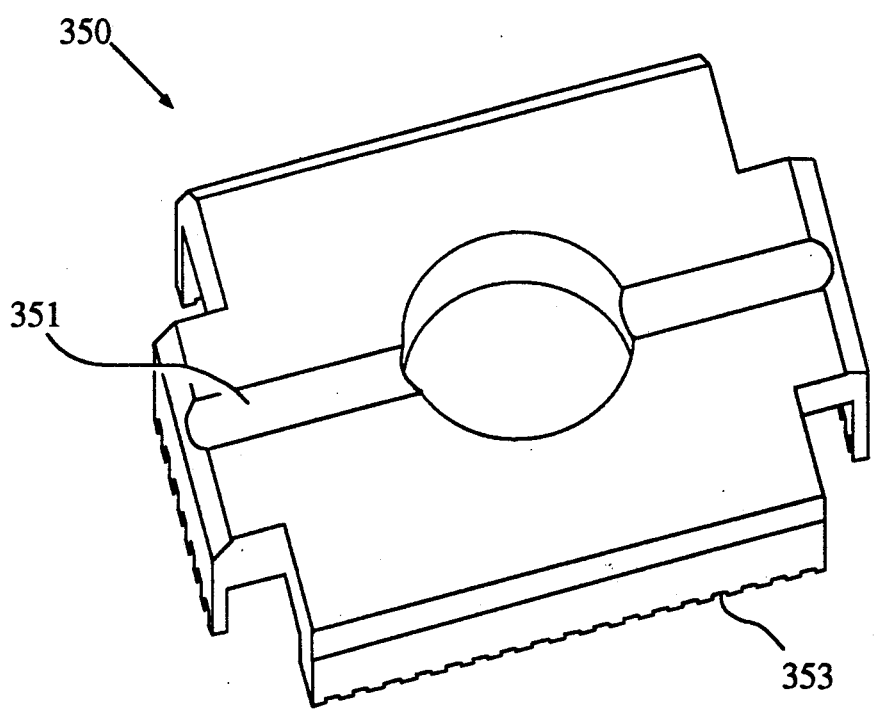
Figure 3C:
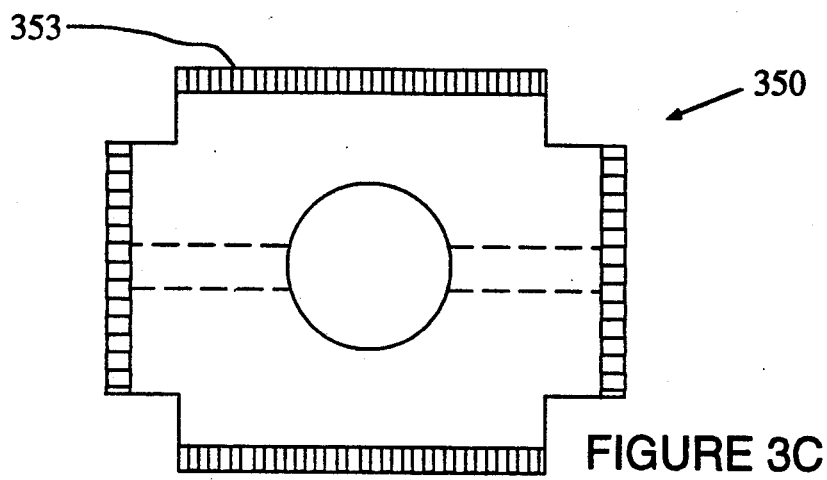
Figure 3D:
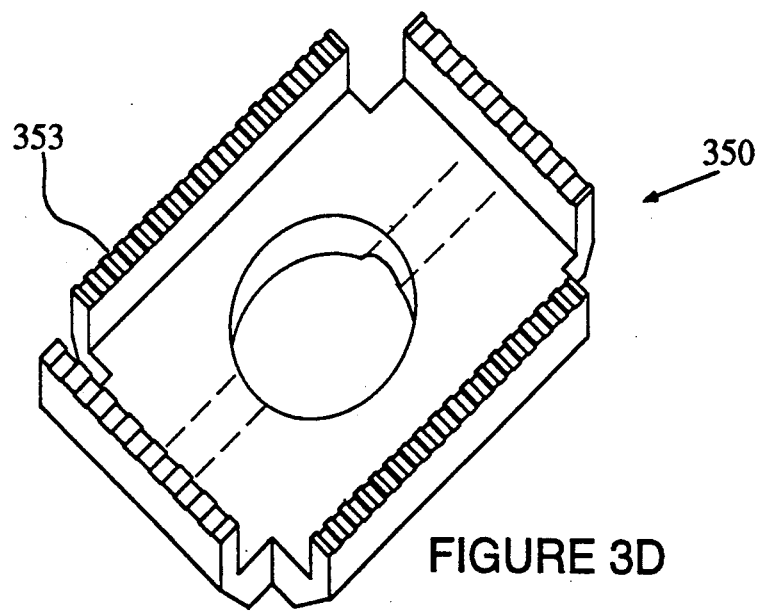
Figure 3E:
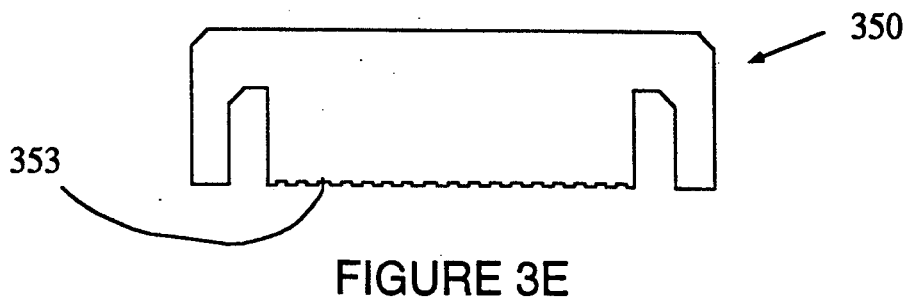

FIG. 2 shows one embodiment of the present invention. FIG. 2 is an exploded view with integrated circuit device 150 positioned above and to one side of its location against contacts 109 in base 111 of socket 300. Positioned above integrated circuit 150 is clamp 350, which according to a preferred embodiment of the invention is a separate unit not permanently attached to bar 321. Clamp 350 must be nonconductive and rigid, and is preferably formed from a hard plastic having high temperature tolerance, such as polybiphenyl sulfone available from Dupont or another plastics vendor. FIGS. 3A-3E show top, top perspective, bottom, bottom perspective, and side views of clamp 350, respectively.

When an integrated circuit device 150 is to be tested, it is positioned with the aid of alignment posts 107 approximately against contacts 109. Then clamp 350 is placed above integrated circuit device 150. Posts 107 align clamp 350 in approximate position against integrated circuit device 150. With lateral motion and pressure from the hand of the individual doing the testing, grooves 353 in clamp 350 come to contain corresponding ones of pins 153 in integrated circuit device 150. Grooves 353 cause pins 153 to become aligned with respect to each other. Both lateral distortion and vertical distortion can be corrected by clamp 350 with the aid of grooves 353. When clamp 350 is in position above integrated circuit 150 with pins 153 seated in grooves 353, lid 101 of socket 300 is closed against clamp 350. Bar 321 presses into channel 351 of clamp 350 applying pressure to clamp 350 which in turn applies pressure to pins 153. By the time latch 113 is latched against hook 114, pins 153 are firmly in contact with their respective ones of contacts 109. Grooves 353 in clamp 350 achieve both horizontal and vertical alignment of pins 153, assuring good contact with contacts 109.

There are a relatively small number of standard package configurations for integrated circuits such as integrated circuit 150. A different embodiment of clamp 350 and socket 300 must be provided for each package type of integrated circuit 150 which will be tested.

Other embodiments of the present invention will become obvious to those skilled in the art in light of the above disclosure. Such additional embodiments are intended to fall within the scope of the present invention.

I claim:

1. A structure for holding an integrated circuit device during testing comprising:
    a clamp comprising:
        a body sized to support an integrated circuit device; and a plurality of grooves, each of said grooves sized and positioned to correspond to a pin in said integrated circuit device;

a socket structure comprising:

a base comprising:

a plurality of contacts spaced to correspond to spacing of pins in said integrated circuit device to be tested, alignment posts sized to hold said integrated circuit device in position against said contacts; and a lid comprising:

means for pressing said clamp against said integrated circuit device;

whereby when said lid is closed against said base with said clamp holding an integrated circuit device positioned in said socket, pins of said integrated circuit device are positioned against respective ones of said contacts for testing said integrated circuit device.

2. A structure for holding an integrated circuit device during testing as in claim 1 in which said clamp is formed from a hard plastic material.

* * * * *